United States Patent [19]
Ikekame et al.

[11] Patent Number: 4,583,158
[45] Date of Patent: Apr. 15, 1986

[54] HIGH VOLTAGE THYRISTOR VALVE

[75] Inventors: Hiroo Ikekame; Toshiaki Matsumoto, both of Tokyo, Japan

[73] Assignee: Kabushiki Kaisha Toshiba, Kawasaki, Japan

[21] Appl. No.: 619,989

[22] Filed: Jun. 12, 1984

[30] Foreign Application Priority Data

Jun. 14, 1983 [JP] Japan ................................ 58-106171

[51] Int. Cl.$^4$ .............................................. H01L 0/00
[52] U.S. Cl. ..................................... 363/68; 248/576; 174/42; 52/573
[58] Field of Search ...................... 52/40, 52, 167, 573; 174/40 TD, 42, 43, 45, 149, 150, 161 R; 200/301; 248/146, 559, 560, 562, 565, 566, 570, 581, 583, 584, 585, 586, 589, 590, 591; 361/333, 334; 363/68

[56] References Cited

U.S. PATENT DOCUMENTS

| 3,129,836 | 4/1964 | Frevel | 248/146 X |
| 3,592,422 | 7/1971 | Norman | 248/581 |
| 3,924,830 | 12/1975 | Collard et al. | 248/576 |
| 3,973,078 | 8/1976 | Wolf et al. | 200/301 |
| 4,384,166 | 5/1983 | Nigol et al. | 174/42 |

OTHER PUBLICATIONS

A New Concept for Mechanical Design of Thyristor Valves for HVDC (CIGRE 1982 session-1-9).

Primary Examiner—Peter S. Wong
Assistant Examiner—Judson H. Jones
Attorney, Agent, or Firm—Oblon, Fisher, Spivak, McClelland & Maier

[57] ABSTRACT

A high voltage thyristor valve of the air insulation type erected upright on a valve hall is disclosed, which comprises a thyristor valve body erected in the valve hall and a plurality of reinforcing means stretched between the thyristor valve body and inner walls of the valve hall, each of the reinforcing means including a wire rope and an insulator.

10 Claims, 9 Drawing Figures

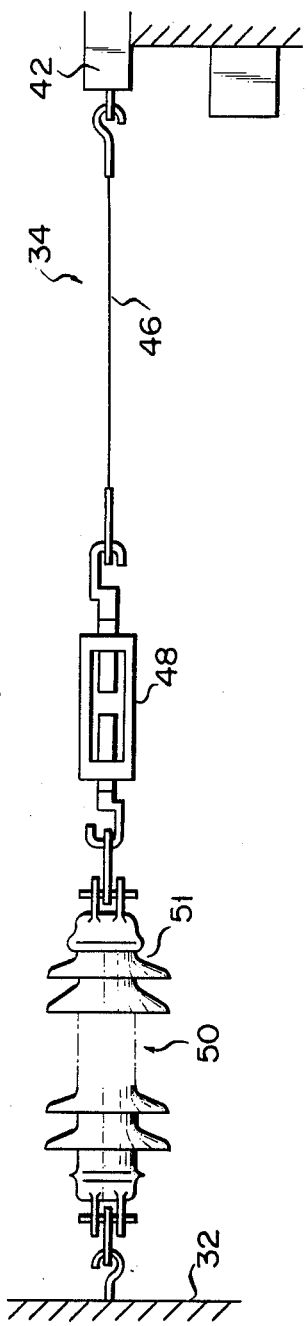
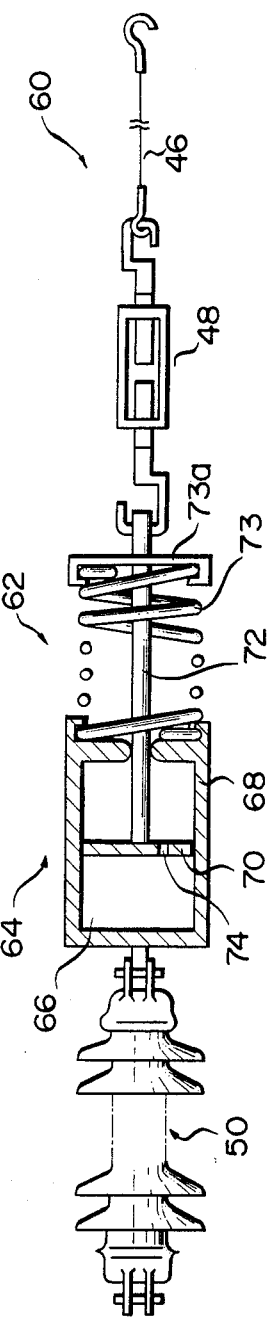
FIG. 6
FIG. 7

HIGH VOLTAGE THYRISTOR VALVE

BACKGROUND OF THE INVENTION

This invention relates to a high voltage thyristor valve 30 accommodated in a valve hall 32 including a thyristor valve body 38 with a tower-like multiple valve structure erected upright on the floor of said valve hall.

Of high voltage thyristor valves (hereinafter referred to merely as a thyristor valve except for the abstract and claims of this application), an air insulating type used for DC transmission and for frequency converters is disposed in a house usually called a valve hall. This type of the thyristor valve is usually comprised of a high multi-layer structure, i.e. a tower type, with a minimum floor area which permits a saving of a floor area and a low-cost construction work thereof and facilitates the inspection and maintenance service thereof.

FIG. 1 is a plan view showing a type of power equipment which comprises the conventional three single-phase thyristor valves 10a, 10b and 10c, erected upright on the floor of a valve hall 12 and connected to respective phases of a three-phase wiring, main buses 14 connected to these thyristor valves, bushings 16 supporting the main buses, and a transformer 18 connected to the main buses. FIG. 2 shows an elevational view of the power equipment shown in FIG. 1. FIG. 3 shows an essential part of the electric wiring of the same power equipment. In FIGS. 1 and 2, the ceiling and one side wall of the valve hall 12 are removed to clearly illustrate the arrangement of the thyristor valves and related components.

Each of the thyristor valves 10a to 10c consists of four valves 20a (FIG. 2), they are called quadruple valves, which are stacked one above another into a tower-like form. Each valve 20a includes a predetermined number of thyristor modules. The thyristor valve 10c for one of the three phases, shown in FIG. 2, has a four-valve stacked structure. Each valve 20a shown in FIG. 2 is called a single valve and has a space in which are accommodated a plurality of units, called thyristor modules 40 (FIG. 4), which accommodate thyristor elements and associated circuits.

Shown enclosed in double-dash-bar rectangles 10a to 10c in FIG. 3, are electric circuits of the thyristor valves, 10a to 10c in FIG. 1, having the tower structure. The single valves 20a shown in FIG. 2, each consisting of a plurality of units called thyristor modules, are generally indicated at 20 in FIG. 3. They are called arms in the electric circuit nomenclature.

The transformer 18 shown in FIG. 1 is shown as two transformers 18a and 18b in FIG. 3 to clearly illustrate the wiring.

The individual single valves 20a shown in FIG. 2 each have an upper and lower frame so that they can be stacked one above another into the thyristor valves 10. Between the upper and lower frames of the single valve 20a is applied a high voltage which is carried by the arm 20 shown in FIG. 1. Therefore, the supports for the upper and lower frames of a single valve must have high insulation capacity and also have sufficient mechanical strength to support the thyristor valves stably and reliably. The mechanical strength must be sufficiently high to prevent the inconveniences as set out below.

(1) The thyristor valve swings toward the nearby apparatus to cause a dielectric breakdown and, in the worst case, it comes into collision with the apparatus to cause a damage.

(2) It is therefore necessary to construct a larger valve hall.

(3) The breakage of a electric lead wire connected to the thyristor valve may occur when it is stretched tight.

(4) Since the thyristor valve greatly swings at its top portion, a bending moment is exerted on the base portion of the thyristor valve, causing a damage there and a resultant overturning.

The supports noted above are usually made of epoxy resin insulators or fiber reinforced plastics (FRP). These insulators and FRP generally have low mechanical strength as compared with metals. If it is intended to reinforce the supports consisting of the insulator or FRP by increasing their size, their weight is undesirably increased.

The vibrations that would be experienced by thyristor valves of the tower-like structure when an earthquake occurs, will now be described by taking the thyristor valve shown in FIGS. 1 and 2 as an example. If the rated voltage of the thyristor valve of the tower-like four-valve (quadruple valve) structure shown in FIGS. 1 and 2 is 250 kV, the thyristor valve would have a height of substantially 11 m because of the necessity of providing a considerably large insulating distance between adjacent single valves. Studies have been made on the vibrations experienced by such a thyristor valve using a numerical analysis method. Generally adopted anti-earthquake standards for power equipment prescribe that a thyristor valve should not be damaged but continue normal operation when it experiences a horizontal vibrating force due to three cycles of a sinusoidal wave with an amplitude acceleration of 300 gal and at the same vibration frequency as its specific frequency. Dimension D1 of the insulator, which is necessary for satisfying this requirement, has been calculated. In addition, dimension D2 of the insulator, which is necessary for satisfying the requirement noted above for a thyristor valve, which consists of only a single valve corresponding to the single valve in the thyristor valve shown in FIG. 2, with a rated voltage of 125 kV, has been calculated. It has been found that D1 is substantially double D2, and the weight in the former case is approximately four times the weight in the latter case. According to the results of the numerical analysis described above, a higher vibratory acceleration is exerted to a higher portion of the thyristor valve. With the thyristor valve of the tower-like four-valve structure with a rated voltage of 250 kV, the acceleration exerted to the top is approximately eight times the acceleration exerted to the top of the solitary single valve with the rated voltage of 125 kV. The amplitude of vibration at the top of the thyristor valve with the rated voltage of 250 kV is as large as approximately 60 cm. Since the lower end of the thyristor valve is installed on the floor, when its top is vibrated, a great bending moment is applied at its lower end as in a cantilever, which is fixed at one end and has the other end free. Thus, a great bending stress is undesirably produced at the lower end.

Meanwhile, thyristor valves have become extensively used for power transmission equipment, and there is a trend for increasing the rated voltage and the capacity of thyristor valves and hence increasing the height and weight thereof. For this reason, there is an increasing demand for safety against vibrations, particularly earthquakes. To meet thus requirement, the size of the support has to be increased so long as the prior art structure as described above is adopted. Doing so leads to increased size and weight of the thyristor valve as a whole. Development of of a new method for solving this problem, therefore, has been demanded.

SUMMARY OF THE INVENTION

An object of the invention is to provide a thyristor valve, which has high mechanical strength in order to withstand applied vibrating forces, which can suppress vibrations due to the applied vibrating forces to a minimum amplitude, and which can be manufactured inexpensively without the need for any large insulating support.

To attain the above object of the invention, a high voltage thyristor valve of this invention 30 includes a plurality of reinforcing means 34, each being stretched between the thyristor valve body 38 and an inner wall of the valve hall 32 and including a wire rope 46 and an insulator 51.

The thyristor valve having this structure, being erected in the valve hall while being coupled by a plurality of reinforcing means to the inner walls of the valve hall, has characteristics similar to those of a beam fixed at both ends. Its mechanical strength against vibrating forces is greatly increased compared with the prior art thyristor valve erected in a valve hall and having cantilever characters with the fixed lower end and free upper end. This structure can suppress vibrations of the thyristor valve, thus reducing the bending stress produced in the thyristor valve due to bending moment applied to various parts thereof. Consequently, the supports constituting the thyristor valve may be small in size and light in weight. In addition, the various disadvantages described above due to great variations of the thyristor valve can be precluded. The thyristor valve according to the invention can thus highly ensure safety against earthquakes as well as against general vibrations.

Since the reinforcing means includes a wire rope, it acts to prevent the vibration of the thyristor valve when it is pulled by the thyristor valve experiencing a vibrating force. However, it has no effect when the vibrating force is in the direction of compressing it. In order to suppress the vibration of the thyristor valve in various directions with the reinforcing means, it is necessary to stretch the reinforcing means in various directions from the thyristor valve. Further, the reinforcing means need not provide any action when the thyristor valve is in the normal upright state. For this reason, the length of the wire rope is preferably adjusted such that the reinforcing means is stretched substantially to be taut, while it actually does not pull the thyristor valve in the normal state. Further, the position of coupling and the direction of stretching the reinforcing means must be determined to avoid twisting the thyristor valve. This would result if only the reinforcing means coupled to the thyristor valve on one side of the centroid just acted effectively when the thyristor valve experiences a vibrating force.

BRIEF DESCRIPTION OF THE DRAWINGS

FIG. 6 is a view showing the reinforcing means used in the structure shown in FIGS. 4 and 5;

FIG. 7 is a front view showing the reinforcing means including a shock absorber;

DETAILED DESCRIPTION OF THE PREFERRED EMBODIMENTS

Figure 4:
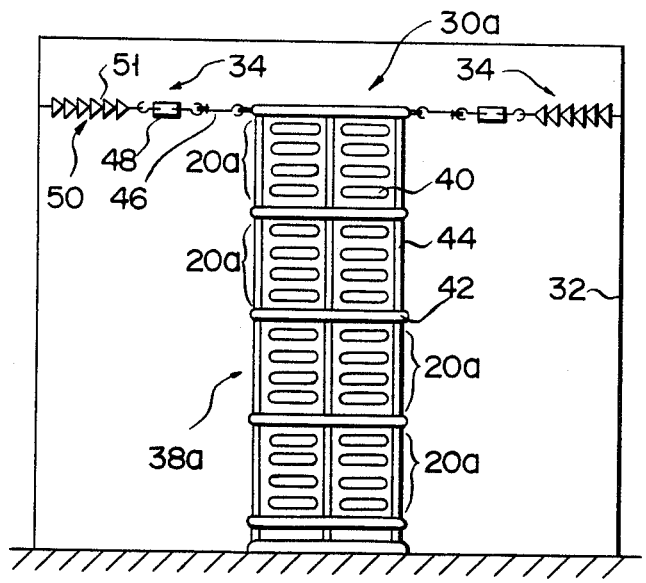
FIG. 4 is an elevational view showing a thyristor valve according to the invention.
Figure 5:
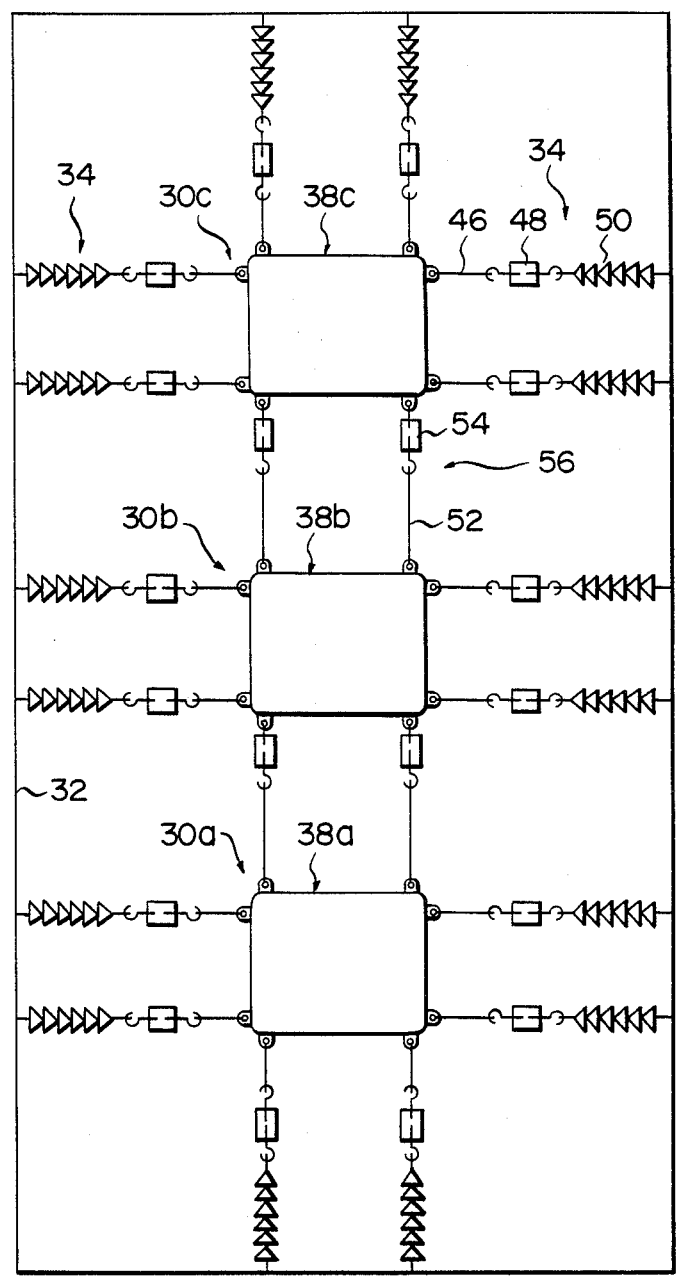
FIG. 5 is a plan view showing the thyristor valve shown in FIG. 4.

The invention will now be described in conjunction with preferred embodiments thereof. Referring to FIGS. 4 and 5, there is shown a thyristor valve according to the invention comprising three thyristor valves 30a to 30c connected to respective phases of a three-phase wiring. The individual thyristor valves are generally designated by reference numeral 30. These thyristor valves are accommodated in a valve hall 32, which is shown as a simple rectangle for the sake of simplicity. They are erected upright on the floor of the valve hall 32. A plurality of reinforcing means 34 are stretched between the individual thyristor valves and corresponding inner walls of the valve hall 32. A plurality of coupling means 56 are stretched between adjacent ones of the thyristor valves. The thyristor valve according to the invention includes the reinforcing means 34 and coupling means 56 as set forth in the claims. To distinguish the thyristor valve according to the invention from the prior art thyristor valve without reinforcing means and coupling means, that portion of the thyristor valve other than the reinforcing means 34 and coupling means 56 will be referred to as the thyristor valve body hereafter. The individual component thyristor valves corresponding to the thyristor valves 30a to 30c are designated at 38a to 38c (and generally at 38).

Figure 1:
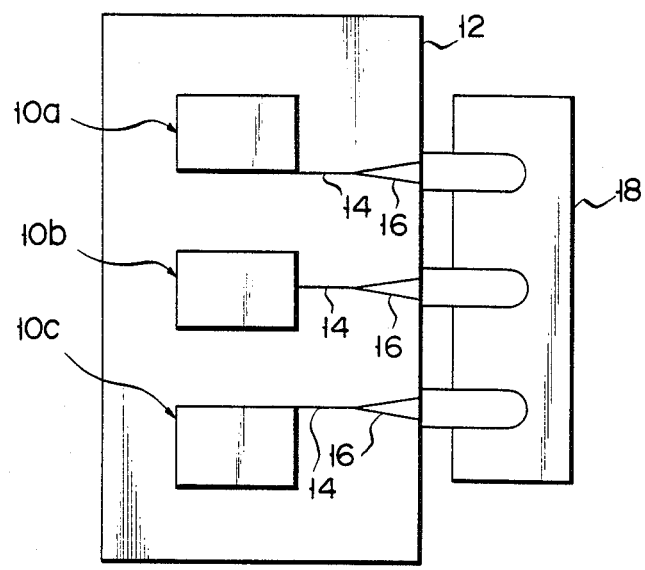
FIG. 1 is a plan view showing the arrangement of a prior art thyristor valve and associated components.
Figure 2:
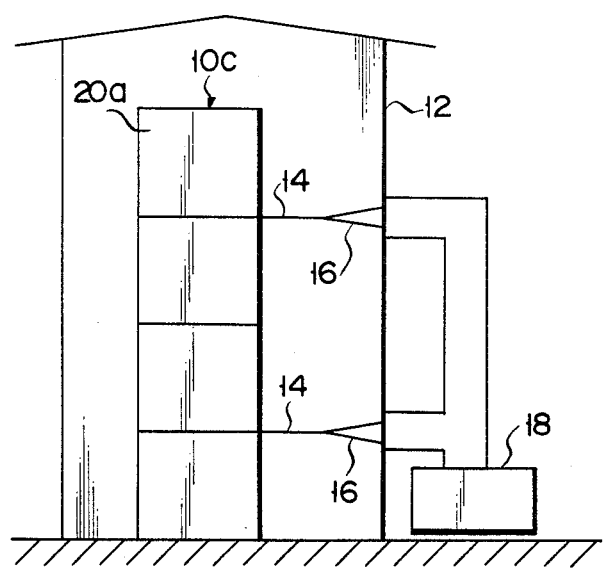
FIG. 2 is a side view showing the arrangement of the thyristor valve and associated components shown in FIG. 1.
Figure 3:
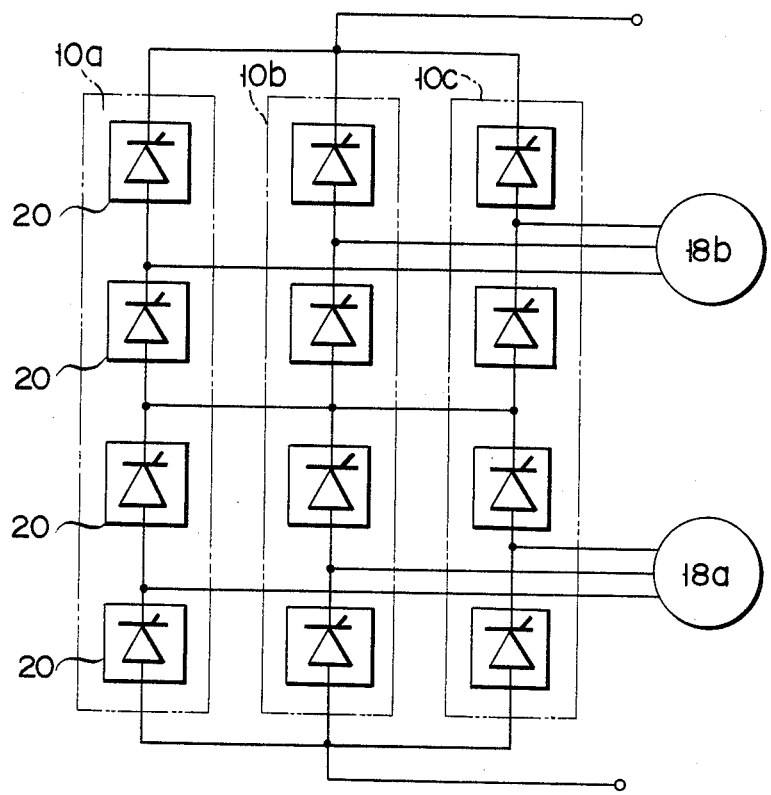
FIG. 3 is a view showing the electric connection of the thyristor valve shown in FIGS. 1 and 2.

FIG. 4 shows only the thyristor valve body 38a of the thyristor valve 30a. The thyristor valve body 38a has a tower-like four-valve (quadruple valve) structure consisting of four single valves 20a stacked one above another using the upper and lower frames 42 thereof. Each single valve 20a includes a predetermined number of thyristor modules 40. To each single valve 20a is applied a high voltage to be carried by the arm 20 shown in FIG. 3. Supports 44 which support the frames of the thyristor valves, therefore, must have a high electrical insulating property to withstand the high voltage noted above. Also, they should have sufficient mechanical strength to sufficiently and safely support the thyristor modules mounted in the individual thyristor valves.

As shown in FIG. 4, each reinforcing means 34 includes a wire rope 46, a turnbuckle 48, and an insulation rod 50 having a row of suspended insulators 51. The reinforcing means 34 are stretched between the top of the frame 42 of the thyristor valve body 38a and corresponding inner walls of the valve hall 32. Usually, higher voltage is carried by thyristor modules 40 at higher positions in the thyristor valve body 38, and the top frame 42 of the thyristor valve 38 is at the same potential as the module 40 at a high potential. The insulation rod 50 serves to ensure insulation of the thyristor valve from the valve hall 32, i.e., from the ground.

FIG. 5 shows a thyristor valve, in which thyristor valve bodies 38a to 38c, connected in three phase connection are accommodated in a valve hall 32. In this case, there is substantially no potential difference between the uppermost frames of the adjacent thyristor valve bodies. Opposed sides of the adjacent thyristor valve bodies, which do not directly face any inner wall of the valve hall, are indirectly coupled to the valve hall inner wall by a coupling means 56, each of which includes a wire rope 52 and a turnbuckle 54. The turnbuckles 48 and 54 are provided for adjusting the length of the reinforcing means 34 and coupling means 56, respectively. The thyristor valve bodies 38a to 38c are erected upright on the floor of the valve hall 32, so that their weight is normally supported on the floor. The length adjustment by the turnbuckle is effected such that the reinforcing means 34 and coupling means 56 are stretched substantially to be taut and practically do not pull the thyristor valve bodies. The reinforcing means 34 and coupling means 56, which include the respective wire ropes 46 and 52, do not push but can only pull the thyristor valve bodies. They will act to hold the thyristor valve bodies in the initial position when the thyristor valve bodies tend to be displaced in a direction which pulls them. Thus, the amplitude of vibration of the thyristor valve bodies and bending stress, generated in the insulating supports 44 of the thyristor valve bodies when the thyristor valve bodies experience a vibrating force, are extremely reduced as compared with a structure where neither reinforcing means nor coupling means are used. There is thus no need to reinforce the frames 42 of the thyristor valve bodies, and particularly the supports 44 to which a high insulating performance is required, by taking into consideration exceptionally great displacements due to a vibrating force.

In order to effectively suppress the vibration of the thyristor valve bodies in many directions, it is effective to provide a large number of reinforcing means 34 on the upper portion of the thyristor valve bodies such that they extend in many different directions, as will be understood from the function of the reinforcing means 34 and coupling means 56. Preferably, the disposition and directions of the reinforcing means are substantially symmetrical with respect to the thyristor valve bodies. In addition, it is necessary to stretch the reinforcing means 34 and coupling means 56 such that the net force, tending to pull the thyristor valve bodies back to the normal position against external vibrating force, is substantially in a direction passing through the centroid of the thyristor valve bodies. Further, although the reinforcing means 34 and coupling means are all shown extending in horizontal directions, this is by no means limited, and they may suitably extend in directions other than horizontal as well, depending on the shape of the valve hall 32, peripheral appartus, and arrangement of the thyristor valve bodies 38a to 38c, so long as the net force tending to pull back the thyristor valve bodies is in a direction passing through the centroid of the thyristor valve bodies as noted before.

The turnbuckles 48 and 54, utilized in the reinforcing means 34 and coupling means 56 shown in FIGS. 4 and 5, are very convenient tools, but they may be omitted in such a case as when the distance between the thyristor valve body and the valve hall inner wall is small enough. In this case, however, it is necessary to carefully determine the lengths of the reinforcing means 34 and coupling means 56 such that substantially the same state as when the turnbuckles are employed can be obtained.

The thyristor valve according to the invention has a very high vibration-proof property against externally applied vibrating forces. This is because deflection characteristic of the thyristor valve body like those of a beam fixed at both ends are obtained by coupling the reinforcing means 34 and coupling means 56 to the thyristor valve bodies 38a to 38c each having deflection characteristic of a cartilever in the manner as described above. With the prior art structure, it has been very difficult to strongly form the frames carrying the thyristor modules against vibrations by using supports requiring a high insulation capacity, because of the fact that the insulating materials have very low mechanical strength as compared with metals. According to the invention, this problem is solved by providing a structure similar to a beam fixed at both ends as the thyristor valve body described above. This arrangement can be accomplished comparatively easily and inexpensively.

FIG. 6 shows the detailed structure of the reinforcing means 34. In the reinforcing means 34 as shown, the wire rope 46 is coupled to the high voltage side frame 42, while the insulation rod 50, consisting of a row of insulators 51, is coupled to the valve hall 32 which is at the ground potential. The turnbuckle 48 is provided between the wire rope 46 and insulation rod 50. It is used to appropriately adjust the state in which the reinforcing means 34 is stretched between the frame 42 and valve hall 32.

FIG. 7 shows a different example of a reinforcing means 60 provided with a shock absorber 62. The shock absorber 62 in this reinforcing means 60 is connected between the turnbuckle 48 and the insulation rod 50 which are the same as those described before in connection with FIG. 6. The shock absorber 62 includes an oil damper 64 and a spring 73. The oil damper 64 has a cylinder 68 filled with operating fluid 66, a piston 70 slidably fitted in the cylinder 68, and a piston rod 72 secured to the piston 70 and coupled to the turnbuckle 48. The piston 70 has a small through hole 74 communicating both sides of the piston, through which the operating fluid 66 can flow under the high flow resistance. The piston rod 72 has a spring retainer 73a secured to it at a position near its remotest end from the piston 70. The spring 73 is interposed between and secured to the spring retainer 73a and cylinder 68. The turnbackle 48 of the reinforcing means 60 of FIG. 7 is coupled through a wire rope to the thyristor valve body frame and the insulation rod 50 coupled through a wire rope to the inner hall of the valve hall. Even when the reinforcing means 60 suffers expanding and contracting forces due to the swinging of the thyristor valve, the vibration of the thyristor valve body is prominently suppressed under a combined damping action of a restoring force resulting from the expansion and contraction of the spring 73 and a resistance given by the oil damper 64. Of course the reinforcing means 60 absorb shocks applied to the valve hall 32. Further, by appropriately selecting the spring constant and damping coefficient of the reinforcing means 60, it is possible to let the vibrations of the thyristor valve body and valve hall cancel one another through the off-setting of the vibration characteristics of the thyristor valve body and those of the valve hall. It is thus possible to control relative displacements and relative speeds of the thyristor valve body and valve hall and to absorb applied vibration or shock energy, thus preventing such hazards damage to the thyristor valve body, collision thereof with nearby apparatus or turn-down thereof. The function of the damper as described is well known in the art, so it is not described here in detail.

Figure 8:
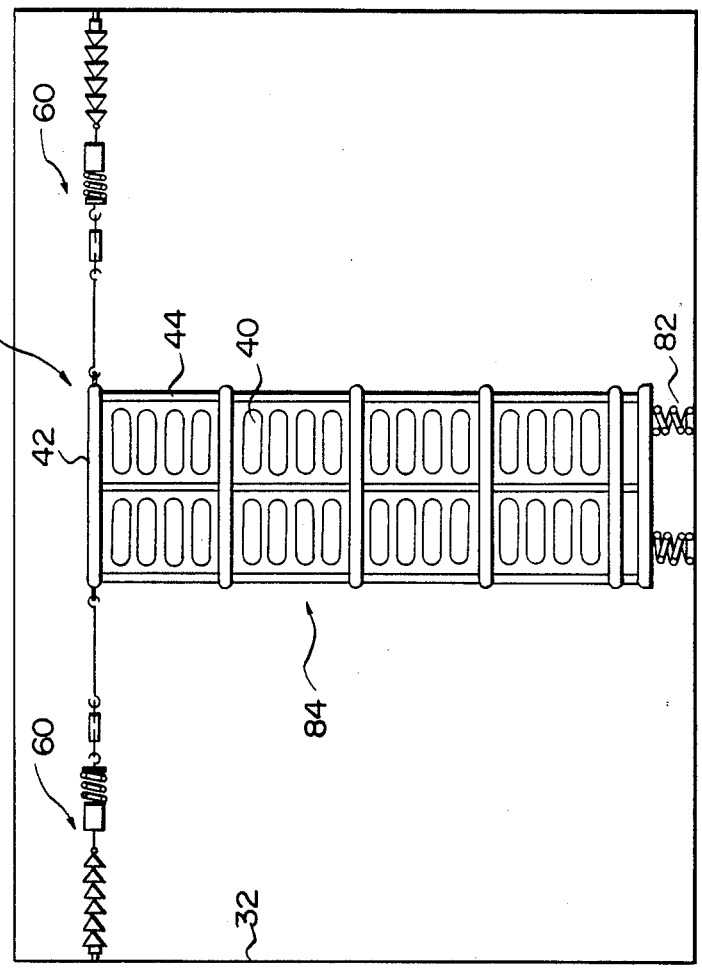
FIG. 8 is an elevational view showing the a different embodiment of the thyristor valve according to the invention.

FIG. 8 shows a different embodiment of the thyristor valve 80, in which the thyristor valve body 84 is mounted by springs 82 on the floor of the valve hall 32, while also using the reinforcing means 60 shown in FIG. 7. If the thyristor valve body is directly installed on the floor, even slight vibration of its top, caused by an earthquake or other causes, would generate great bending stress in its lower end. In this thyristor valve 80, the lower end of the thyristor valve body has a flexible structure provided by the springs 82, which is so flexible that it presents no practical problem to the overall structure. This flexible structure section effectively avoids the generation of great stress in it and improves safety against vibrations.

Figure 9:
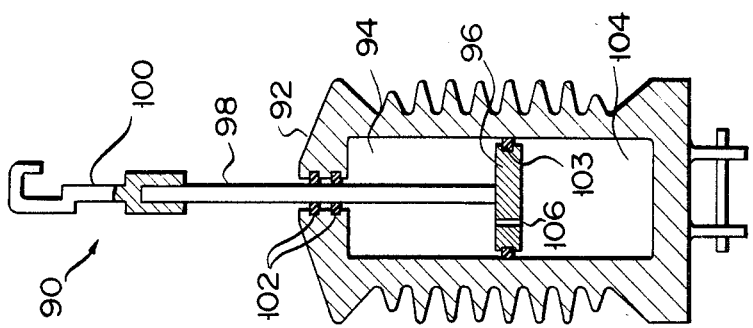
FIG. 9 is an axial sectional view showing a small-size buffer used as a reinforcing means.

FIG. 9 shows a small size damper 90. This damper 90 includes an insulator 92, which is constructed such that it also serves as a cylinder of an oil damper. A piston 96 is reciprocably fitted in a space or cavity 94 in the insulator 92, which is filled with fluid 104. A piston rod 98 extending from the piston 96 is coupled by a hook 100 to a turnbuckle (not shown). The remotest end of the insulator 92 from the turnbuckle is coupled to a valve hall (not shown). The piston 96 has a small hole 106 through which the operating fluid can flow under a high flow resistance. Reference numeral 102 designates O-rings, and numeral 103 designates a piston ring.

When force is applied between the piston rod 98 and insulator 92 of the damper 90 and tends to move the piston 96 relative to the insulator 92, the small hole 106 acts to suppress movement of the piston 96. This damper 90 may be fabricated as a small size unit with a reduced number of components, so that it may be conveniently used in a case where the distance between thyristor valve body and valve hall inner wall is small.

What is claimed is:

1. A high voltage thyristor valve accommodated in a valve hall, comprising:
    a thyristor valve body having a tower-like multiple-valve structure erected upright on the floor of said valve hall; and
    at least two reinforcing means, each being stretched between said thyristor valve body and an inner wall of said valve hall and including a wire rope and an insulator for reducing vibrational stress to the thyristor.

2. The high voltage thyristor valve according to claim 1, wherein:
    said reinforcing means further includes a shock absorber with a spring.

3. The high voltage thyristor valve according to claim 2, wherein:
    said shock absorber further includes a damper.

4. The high voltage thyristor valve according to claim 1, wherein:
    said reinforcing means further includes a turnbuckle for adjusting the length thereof.

5. The high voltage thyristor valve according to claim 1, further comprising:
    spring means provided between a lower end of said thyristor valve body and the floor of said valve hall.

6. A high voltage thyristor valve accommodated in a valve hall, comprising:
    a plurality of valve bodies, each having a tower-like multiple-valve structure erected upright on the floor of said valve hall;
    a plurality of reinforcing means, each being stretched between said thyristor valve body and an inner wall of said valve hall and including a wire rope and an insulator for reducing vibrational stress to the thyristor; and
    coupling means stretched between adjacent two said thyristor valve bodies and including a rope.

7. The high voltage thyristor valve according to claim 6, wherein:
    said reinforcing means further includes a shock absorber with a spring.

8. The high voltage thyristor valve according to claim 7, wherein:
    said shock absorber further includes a damper.

9. The high voltage thyristor valve according to claim 6, wherein:
    said reinforcing means further includes a turnbuckle for adjusting the length thereof; and
    said coupling means further includes a turnbuckle for adjusting the length thereof.

10. The high voltage thyristor valve according to claim 6, further comprising:
    a plurality of spring means, each provided between a lower end of each of said plurality of thyristor valve bodies and the floor of said valve hall.

* * * * *